United States Patent
Slater, Jr. et al.

(10) Patent No.: US 6,740,906 B2
(45) Date of Patent: May 25, 2004

(54) LIGHT EMITTING DIODES INCLUDING MODIFICATIONS FOR SUBMOUNT BONDING

(75) Inventors: David B. Slater, Jr., Raleigh, NC (US); Bradley E. Williams, Cary, NC (US); Peter S. Andrews, Durham, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 10/200,244

(22) Filed: Jul. 22, 2002

(65) Prior Publication Data

US 2003/0015721 A1 Jan. 23, 2003

Related U.S. Application Data

(63) Continuation-in-part of application No. 10/057,821, filed on Jan. 25, 2002.
(60) Provisional application No. 60/352,941, filed on Jan. 30, 2002, provisional application No. 60/307,311, filed on Jul. 23, 2001, and provisional application No. 60/307,234, filed on Jul. 23, 2001.

(51) Int. Cl.$^7$ .................. H01L 33/00; H01L 23/495
(52) U.S. Cl. .................. 257/99; 257/98; 257/91; 257/676; 257/778
(58) Field of Search .................. 257/98, 99, 676, 257/778, 91, 100, 744, 745, 749; 438/22, 25, 123, 108

(56) References Cited

U.S. PATENT DOCUMENTS

| | | | |
|---|---|---|---|
| 4,918,497 A | 4/1990 | Edmond | |
| 4,966,862 A | 10/1990 | Edmond | 437/100 |
| 5,006,908 A | 4/1991 | Matsuoka et al. | 357/17 |
| 5,027,168 A | 6/1991 | Edmond | |
| 5,087,949 A | 2/1992 | Haitz | 357/17 |
| 5,187,547 A | 2/1993 | Niina et al. | 257/77 |

(List continued on next page.)

FOREIGN PATENT DOCUMENTS

| | | |
|---|---|---|
| EP | 0 051 172 A1 | 5/1982 |
| EP | 0 961 328 A2 | 12/1999 |
| EP | 1 168 460 A2 | 1/2002 |
| GB | 2 346 480 A | 8/2000 |
| JP | 61110476 | 5/1986 |

(List continued on next page.)

OTHER PUBLICATIONS

International Search Report, PCT/US02/23266, May 22, 2003.
International Search Report, PCT/US02/02849, Dec. 2, 2002.
U.S. application Ser. No. 10/003,331, filed Oct. 31, 2001, *Low Temperature Formation of Backside Ohmic Contacts for Vertical Devices.*

(List continued on next page.)

Primary Examiner—Nathan J. Flynn
Assistant Examiner—Tan Tran
(74) Attorney, Agent, or Firm—Myers Bigel Sibley & Sajovec

(57) ABSTRACT

Light emitting diodes include a substrate, an epitaxial region on the substrate that includes therein a diode region and a multilayer conductive stack on the epitaxial region opposite the substrate. A passivation layer extends at least partially on the multilayer conductive stack opposite the epitaxial region, to define a bonding region on the multilayer conductive stack opposite the epitaxial region. The passivation layer also extends across the multilayer conductive stack, across the epitaxial region and onto the substrate. The multilayer conductive stack can include an ohmic layer on the epitaxial region opposite the substrate, a reflector layer on the ohmic layer opposite the epitaxial region and a tin barrier layer on the reflector layer opposite the ohmic layer. An adhesion layer also may be provided on the tin barrier layer opposite the reflector layer. A bonding layer also may be provided on the adhesion layer opposite the tin barrier layer. A submount and a bond between the bonding layer and the submount also may be provided.

57 Claims, 6 Drawing Sheets

U.S. PATENT DOCUMENTS

| | | | |
|---|---|---|---|
| 5,210,051 A | 5/1993 | Carter, Jr. | 437/107 |
| 5,237,182 A | 8/1993 | Kitagawa et al. | 257/15 |
| 5,247,533 A | 9/1993 | Okazaki et al. | 372/45 |
| 5,338,994 A | 8/1994 | Lezan et al. | |
| 5,369,289 A | 11/1994 | Tamaki et al. | 257/99 |
| 5,393,993 A | 2/1995 | Edmond et al. | 257/77 |
| 5,416,342 A | 5/1995 | Edmond et al. | 257/76 |
| 5,523,589 A | 6/1996 | Edmond et al. | 257/77 |
| 5,585,648 A | 12/1996 | Tischler | |
| 5,604,135 A | 2/1997 | Edmond et al. | |
| 5,631,190 A | 5/1997 | Negley | |
| 5,718,760 A | 2/1998 | Carter et al. | 117/84 |
| 5,739,554 A | 4/1998 | Edmond et al. | |
| 5,760,479 A | 6/1998 | Yang et al. | |
| 5,767,581 A | 6/1998 | Nakamura et al. | 257/749 |
| 5,777,350 A | 7/1998 | Nakamura et al. | 257/96 |
| 5,779,924 A | 7/1998 | Krames et al. | 216/24 |
| 5,912,477 A | 6/1999 | Negley | 257/95 |
| 5,917,202 A | 6/1999 | Haitz et al. | 257/98 |
| 5,952,681 A | 9/1999 | Chen | 257/89 |
| 6,015,719 A | 1/2000 | Kish, Jr. et al. | |
| 6,046,465 A | 4/2000 | Wang et al. | 257/98 |
| 6,091,085 A | 7/2000 | Lester | 257/98 |
| 6,097,041 A | 8/2000 | Lin et al. | 257/98 |
| 6,118,259 A | 9/2000 | Bucks et al. | 323/312 |
| 6,120,600 A | 9/2000 | Edmond et al. | |
| 6,121,636 A | 9/2000 | Morita et al. | 257/99 |
| 6,121,637 A | 9/2000 | Isokawa et al. | 257/99 |
| 6,133,589 A | 10/2000 | Krames et al. | 257/103 |
| 6,139,166 A | 10/2000 | Marshall et al. | 362/231 |
| 6,147,458 A | 11/2000 | Bucks et al. | 325/225 |
| 6,169,294 B1 | 1/2001 | Biing-Jye et al. | 257/79 |
| 6,177,688 B1 | 1/2001 | Linthicum et al. | 257/77 |
| 6,187,606 B1 | 2/2001 | Edmond et al. | |
| 6,194,742 B1 | 2/2001 | Kern et al. | 257/94 |
| 6,201,264 B1 | 3/2001 | Khare et al. | 257/97 |
| 6,204,523 B1 | 3/2001 | Carey et al. | 257/98 |
| 6,222,207 B1 | 4/2001 | Carter-Coman et al. | 257/98 |
| 6,229,160 B1 | 5/2001 | Krames et al. | 257/94 |
| 6,455,878 B1 | 9/2002 | Bhat et al. | |
| 2003/0006418 A1 | 1/2003 | Emerson et al. | |
| 2003/0025212 A1 * | 2/2003 | Bhat et al. | 257/780 |

FOREIGN PATENT DOCUMENTS

| | | |
|---|---|---|
| JP | 07-235729 | 9/1995 |
| JP | 08-321660 | 12/1996 |
| JP | 9-82587 | 3/1997 |
| JP | 09-223846 | 8/1997 |
| JP | 10-163530 | 6/1998 |
| JP | 10-233549 | 9/1998 |
| JP | 10-256604 | 9/1998 |
| JP | 11-150302 A | 6/1999 |
| JP | 11-191641 A | 7/1999 |
| JP | 11-220168 A | 8/1999 |
| JP | 2000-77713 A | 3/2000 |
| JP | 2000-195827 | 7/2000 |
| WO | WO 00/33365 A1 | 6/2000 |
| WO | WO 01/47039 A1 | 6/2001 |

OTHER PUBLICATIONS

U.S. application Ser. No. 60/411,980, filed Sep. 19, 2002, *Phosphor–Coated Light Emitting Diodes Including Tapered Sidewalls, and Fabrication Methods*.

U.S. application Ser. No. 60/307/235, filed Jul. 23, 2001, *Light Emitting Diodes Including Modifications for Light Extraction and Manufacturing Methods Therefor*.

U.S. application Ser. No. 60/294,445, filed May 30, 2001, *Multi–Quantum Well Light Emitting Diode Structure*.

U.S. application Ser. No. 60/294,378, filed May 30, 2001, *Light Emitting Diode Structure With Multi–Quantum Well and Superlattice Structure*.

U.S. application Ser. No. 60/294,308, filed May 30, 2001, *Light Emitting Diode Structure With Superlattice Structure*.

U.S. application Ser. No. 09/787,189, filed Mar. 15, 2001, *Low Temperature Formation of Backside Ohmic Contacts for Vertical Devices*.

U.S. application Ser. No. 60/265,707, filed Feb. 1, 2001, *Light Emitting Diode With Optically Transparent Silicon Carbide Substrate*.

Mensz et al., $In_xGa_{1-x}N/Al_yGa_{1-y}N$ *Violet Light Emitting Diodes With Reflective p–Contacts for High Single Sided Light Extraction*, Electronics Letters, vol. 33, No. 24, Nov. 20, 1997, pp. 2066–2068.

Honma et al., *Evaluation of Barrier Metals of Solder Bumps for Flip–Chip Interconnection*, Electronic Manufacturing Technology Symposium, 1995, Proceedings of 1995 Japan International, 18th IEEE/CPMT, Dec. 4, 1995, pp. 113–116.

Lee et al., *Bonding of InP Laser Diodes by Au–Sn Solder and Tungsten–Based Barrier Metallization Schemes*, Semiconductor Science and Technology, vol. 9, No. 4, 4/94, pp. 379–386.

*OSRAM Enhances Brightness of Blue InGaN LEDs*, Compound Semiconductor, vol. 7, No. 1, Feb. 2001, p. 7.

Craford *Outlook for AlInGaP Technology*, Presentation, Strategies in Light 2000.

Krames et al., *High–Power Truncated–Inverted–Pyramid $(Al_xGa_{1-x})_{0.5}In_{0.5}P/GaP$ Light–Emitting Diodes Exhibiting >50% External Quantum Efficiency*, Applied Physics Letters, vol. 75, No. 16, Oct. 18, 1999, pp. 2365–2367.

Lambrecht et al., *Band Structure Interpretation of the Optical Transitions Between Low–Lying Conduction Bands in n–Type Doped SiC Polytypes*, Materials Science Forum, vols. 264–268, 1998, pp. 271–274.

Craford, *Overview of Device Issues in High–Brightness Light–Emitting Diodes*, Chapter 2, *High Brightness Light Emitting Diodes: Semiconductors and Semimetals*. vol. 48, Stringfellow et al. ed., Academic Press, 1997, pp. 47–63.

Yoo et al., *Bulk Crystal Growth of 6H–SiC on Polytype–Controlled Substrates Through Vapor Phase and Characterization*, Journal of Crystal Growth, vol. 115, vol. 1991, pp. 733–739.

Biederman, *The Optical Absorption Bands and Their Anisotropy in the Various Modifications of SiC*, Solid State Communications, vol. 3, 1965, pp. 343–346.

U.S. application Ser. No. 09/154,363, entitled *Vertical Geometry InGaN LED*.

International Search Report, PCT/US02/02849, Aug. 26, 2002.

* cited by examiner

LIGHT EMITTING DIODES INCLUDING MODIFICATIONS FOR SUBMOUNT BONDING

CROSS-REFERENCE TO RELATED APPLICATIONS

This application claims the benefit of and priority from Provisional Application Ser. No. 60/352,941, filed Jan. 30, 2002, entitled *LED Die Attach Methods and Resulting Structures,* Provisional Application Ser. No. 60/307,311, filed Jul. 23, 2001, entitled *Flip Chip Bonding of Light Emitting Diodes,* Provisional Application Ser. No. 60/307,234, filed Jul. 23, 2001 entitled *Thermosonic Bonding of Flip Chip Light-Emitting Diodes,* and is a continuation-in-part ("CIP") of application Ser. No. 10/057,821, filed Jan. 25, 2002, entitled *Light Emitting Diodes Including Modifications for Light Extraction and Manufacturing Methods Therefor,* the disclosures of all of which are hereby incorporated herein by reference in their entirety as if set forth fully herein.

FIELD OF THE INVENTION

This invention relates to microelectronic devices and fabrication methods therefor, and more particularly to light emitting devices, such as light emitting diodes (LEDs) and manufacturing methods therefor.

BACKGROUND OF THE INVENTION

Light emitting diodes are widely used in consumer and commercial applications. As is well known to those having skill in the art, a light emitting diode generally includes a diode region on a microelectronic substrate. The microelectronic substrate may comprise, for example, gallium arsenide, gallium phosphide, alloys thereof, silicon carbide and/or sapphire. Continued developments in LEDs have resulted in highly efficient and mechanically robust light sources that can cover the visible spectrum and beyond. These attributes, coupled with the potentially long service life of solid state devices, may enable a variety of new display applications, and may place LEDs in a position to compete with the well entrenched incandescent and fluorescent lamps.

Gallium Nitride (GaN)-based LEDs typically comprise an insulating or semiconducting substrate such as silicon carbide (SiC) or sapphire on which a plurality of GaN-based epitaxial layers are deposited. The epitaxial layers comprise an active or diode region having a p-n junction which emits light when energized.

LEDs may be mounted substrate side down onto a submount, also called a package or lead frame (hereinafter referred to as a "submount"). In contrast, flip-chip mounting of light emitting diodes involves mounting the LED onto the submount with the substrate side facing up (i.e. away from the submount). Light may be extracted and emitted through the substrate. Flip chip mounting may be an especially desirable technique for mounting SiC-based LEDs. In particular, since SiC has a higher index of refraction than GaN, light generated in the active or diode region generally does not totally internally reflect (i.e. reflect back into the GaN-based layers) at the GaN/SiC interface. Flip chip mounting of SiC-based LEDs also can improve the effect of certain substrate-shaping techniques known in the art. Flip chip packaging of SiC LEDs may have other benefits, such as improved heat dissipation, which may be desirable depending on the particular application for the LED.

Because of the high index of refraction of SiC, light passing through an SiC substrate tends to be totally internally reflected into the substrate at the surface of the substrate unless the light strikes the surface at a fairly low angle of incidence (i.e. fairly close to normal). The critical angle for total internal reflection generally depends on the material with which SiC forms an interface. It is possible to increase the light output from an SiC-based LED by shaping the SiC substrate in a manner that limits total internal reflection by causing more rays to strike the surface of the SiC at low angles of incidence. A number of such shaping techniques and resulting devices are taught in the above-cited U.S. patent application Ser. No. 10/057,821.

One potential problem with flip-chip mounting is that when an LED is mounted on a submount using conventional techniques, a conductive die attach material such as silver epoxy is deposited on the LED and/or on the package, and the LED and the submount are pressed together. This can cause the viscous conductive die attach material to squeeze out and make contact with the N-type substrate and/or layers in the device, thereby forming a Schottky diode connection that can short-circuit the p-n junction in the active region.

Metal-metal bonds formed by soldering, thermosonic scrubbing and/or thermocompression bonding are alternative attach techniques. However, tin (Sn) is a component of most types of solder, and migration of Sn from the bonded surface into the device can cause unwanted degradation of the device. Such migration can interfere with metal-semiconductor interfaces such as ohmic contacts and/or the function of metal—metal interfaces such as reflective interfaces that serve as mirrors.

SUMMARY OF THE INVENTION

Light emitting diodes according to some embodiments of the present invention include a substrate, an epitaxial region on the substrate that includes therein a diode region, and a multilayer conductive stack including a barrier layer on the epitaxial region opposite the substrate. A passivation layer extends at least partially on the multilayer conductive stack opposite the epitaxial region, to define a bonding region on the multilayer conductive stack opposite the epitaxial region. The passivation layer also extends across the multilayer conductive stack, across the epitaxial region and onto the substrate.

In some embodiments of the present invention, the passivation layer is non-wettable to a bonding material that is used to attach the bonding region to a submount. In other embodiments of the present invention, the multilayer conductive stack and the epitaxial region both include a sidewall, and the passivation layer extends on the sidewalls of the multilayer conductive stack and the epitaxial region. In still other embodiments of the present invention, a bonding layer is provided on the bonding region. In some embodiments of the present invention, the bonding layer includes a sidewall and the passivation layer also extends onto the sidewall of the bonding layer. In yet other embodiments, the passivation layer does not extend on the bonding layer sidewall. In still other embodiments of the present invention, an adhesion layer and/or a solder wetting layer are provided between the multilayer conductive stack and the bonding layer. In yet other embodiments of the present invention, the adhesion layer includes an adhesion layer sidewall and the passivation layer also extends on the adhesion layer sidewall. In still other embodiments, the passivation layer does not extend on the adhesion layer sidewall.

In still other embodiments of the present invention, the substrate includes a first face adjacent the epitaxial region and a second face opposite the epitaxial region. In some embodiments of the present invention, the bonding layer has smaller surface area than the multilayer conductive stack, the multilayer conductive stack has smaller surface area than the epitaxial region and the epitaxial region has smaller surface area than the first face. In other embodiments of the present invention, the second face also has smaller surface area than the first face.

Still other embodiments of the present invention include a submount and a bond between the bonding region and the submount. In some embodiments of the present invention, the bond is a thermocompression bond. In other embodiments of the present invention, the bond comprises solder.

Light emitting diodes according to other embodiments of the present invention include a substrate having first and second opposing faces, the second face having smaller surface area than the first face. An epitaxial region is provided on the first face that includes therein a diode region. An ohmic layer is on the epitaxial region opposite the substrate. A reflector layer is on the ohmic layer opposite the epitaxial region. A barrier layer is on the reflector layer opposite the ohmic layer. An adhesion layer is on the barrier layer opposite the reflector layer. A bonding layer is on the adhesion layer opposite the barrier layer. In other embodiments, a solder wetting layer is on the adhesion layer opposite the barrier layer. Other embodiments of the present invention further comprise a submount and a bond between the bonding layer and the submount.

In some embodiments of the present invention, the ohmic layer comprises platinum, palladium, nickel/gold, nickel oxide/gold, nickel oxide/platinum, titanium and/or titanium/gold. In still other embodiments of the present invention, the reflector layer comprises aluminum and/or silver. In some embodiments of the present invention, the barrier layer comprises tungsten, titanium/tungsten and/or titanium nitride/tungsten. In other embodiments of the present invention, the barrier layer comprises a first layer comprising tungsten, and a second layer comprising nickel on the first layer. In some embodiments of the present invention, the solder has a reflow temperature of less than about 210° C., and the barrier layer comprises a layer of titanium/tungsten that is between about 500 Å thick and about 50,000 Å thick. In other embodiments of the present invention, the solder has a reflow temperature of more than about 210° C. and the barrier layer comprises a first layer of titanium/tungsten that is about 5000 Å thick, and a second layer comprising nickel that is about 2000 Å thick, on the first layer. In still other embodiments of the present invention, the solder has a reflow temperature of more than about 250° C. and the barrier layer comprises a first layer of titanium/tungsten that is about 5000 Å thick and a second layer comprising nickel that is about 2000 Å thick, on the first layer.

In other embodiments of the present invention, the epitaxial region has smaller surface area than the second face. The barrier layer, the reflector layer and the ohmic layer have same surface area which is less than that of the epitaxial region. The adhesion layer and the bonding layer have same surface area that is smaller than that of the barrier layer, the reflective layer and the ohmic layer. In still other embodiments of the present invention, a passivation layer as was described above also may be provided.

Passivation layers according to some embodiments of the present invention provide means for preventing an external short circuit across the epitaxial region. Moreover, a barrier layer comprising a tungsten, titanium/tungsten and/or titanium nitride/tungsten layer or titanium/tungsten and nickel layers according to some embodiments of the present invention provide means for reducing migration of tin and/or other potentially deleterious materials into the multilayer conductive stack.

Light emitting diodes may be fabricated, according to some embodiments of the present invention, by epitaxially forming a plurality of spaced apart mesa regions on a substrate, wherein the mesa regions include therein a diode region. First reduced area regions are defined on the mesa regions, for example using photolithography. A multilayer conductive stack that includes a barrier layer is formed on the first reduced area regions of the mesa regions. A passivation layer is formed on the substrate between the mesa regions, on exposed portions of the mesa regions and on exposed portions of the multilayer conductive stacks. The barrier layer defines second reduced area regions on the multilayer conductive stacks. A bonding layer is formed on the second reduced area regions of the multilayer conductive stacks. The substrate is then diced between the mesas, to produce a plurality of light emitting diodes. In other embodiments of the present invention, the dicing is followed by bonding the bonding layer to a submount. In some embodiments of the present invention, thermocompression bonding is used. In other embodiments of the present invention, solder bonding is used.

DETAILED DESCRIPTION OF THE PREFERRED EMBODIMENT

Figure 1:
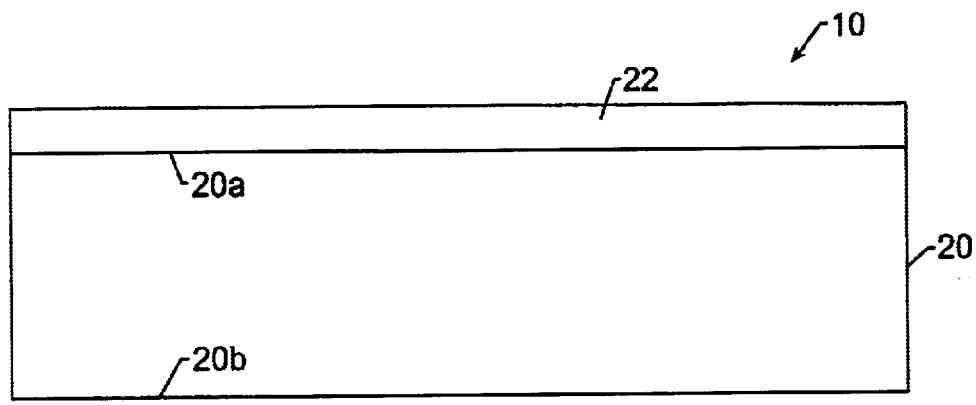
FIGS. 1–10 are cross-sectional views of light emitting diodes according to some embodiments of the present invention during intermediate fabrication steps according to some embodiments of the present invention.

The present invention now will be described more fully hereinafter with reference to the accompanying figures, in which embodiments of the present invention are shown. This invention may, however, be embodied in many alternate forms and should not be construed as limited to the embodiments set forth herein.

Accordingly, while the present invention is susceptible to various modifications and alternative forms, specific embodiments thereof are shown by way of example in the drawings and will herein be described in detail. It should be understood, however, that there is no intent to limit the present invention to the particular forms disclosed, but on the contrary, the present invention is to cover all modifications, equivalents, and alternatives falling within the spirit and scope of the present invention as defined by the claims. Like numbers refer to like elements throughout the description of the figures. In the figures, the dimensions of layers and regions may be exaggerated for clarity. It will also be understood that when an element, such as a layer, region or substrate, is referred to as being "on" another element, it can be directly on the other element or intervening elements may also be present. In contrast, when an element, such as a layer, region or substrate, is referred to as being "directly on" another element, there are no intervening elements present. Moreover, each embodiment described and illustrated herein includes its complementary conductivity type embodiment as well.

Embodiments of the present invention now will be described generally with reference to gallium nitride-based light emitting diodes on silicon carbide-based substrates. However, it will be understood by those having skill in the art that many embodiments of the present invention may employ any combination of a substrate that is non-absorbing or transparent to the emitted light and an index matched light emitting diode epitaxial layer. In some embodiments of the present invention, the refractive index of the substrate is greater than that of the diode. Accordingly, combinations can include an AlGaInP diode on a GaP substrate; an InGaAs diode on a GaAs substrate; an AlGaAs diode on a GaAs substrate; an SiC diode on an SiC substrate, an SiC diode on a sapphire ($Al_2O_3$) substrate; and/or a nitride-based diode on a gallium nitride, silicon carbide, aluminum nitride, zinc oxide and/or other substrate.

Some embodiments of the present invention provide a metal stack with a passivation layer on its perimeter that defines a bonding region on LED devices that can be well suited for die attachment via soldering and/or thermosonic scrub bonding. Other embodiments of the present invention provide LED devices that can be flip chip mounted using soldering and/or thermosonic bonding, and that include a barrier layer that can reduce or eliminate unwanted degradation of the metal and/or semiconductor layers of the LED. Still other embodiments of the present invention can provide both the passivation layer and the barrier layer. Yet other embodiments of the present invention provide methods of fabricating these LED devices. Passivation layers according to some embodiments of the present invention can provide means for preventing a short circuit across the diode region. Moreover, barrier layers according to some embodiments of the present invention can provide means for reducing migration of tin and/or other undesired materials into the LED.

In a conventional sapphire-based approach, an LED, also referred to as a chip or die, is attached to a submount with a clear epoxy. In the case of LEDs having conductive SiC substrates, a conducting silver filled epoxy is typically used to attach the LED and the submount to one another. Conventional nitride-based LEDs on SiC or sapphire substrates generally are packaged with the epitaxial side up and with the substrate bonded to the submount.

Some embodiments of conventional SiC-based LEDs have an n-type conductive substrate and an epitaxial region on the substrate that includes one or more n-type epitaxial layers and one or more p-type epitaxial layers to define a diode region. A transparent ohmic contact may be formed on the p-type epitaxial LED surface. As discussed in U.S. patent application Ser. No. 10/057,821, referenced above, it may be beneficial to form a reflector layer over the thin transparent ohmic contact to improve light extraction from the device. The reflective layer can serve to spread electric current uniformly across the thin contact, and also to reflect light back into the substrate, away from the submount.

Unfortunately, if Sn and/or other contaminants from a solder or thermosonic/thermocompression bond migrates from the bonding surface to the reflector layer, the reflector layer may become less reflective. Moreover, if the contaminants migrate beyond the reflector to the transparent ohmic contact, the transparent ohmic contact may develop a higher specific contact resistivity, thus increasing the forward voltage ($V_F$) of the device. Both of these results may be characterized as degradation of the device.

A reflective layer may comprise Ag and/or Al, and the thin transparent ohmic layer can comprise Pt, Pd, Ni, Ti, Au or a combination of these elements. Unfortunately, Sn readily forms alloys with Ag, Pt, Au and with numerous other metals used in semiconductor manufacturing.

A first portion of a series of conductive layers (referred to herein as a "multilayer conductive stack") that may be formed on the p-type surface of an LED according to some embodiments of the present invention comprises an ohmic layer, a reflector layer, and a barrier layer. In some embodiments, the barrier layer comprises a thin layer of titanium, titanium/tungsten (TiW) and/or titanium nitride/ tungsten (TiNW). In other embodiments, the barrier layer comprises a first layer of titanium/tungsten and a second layer comprising nickel on the first layer.

In some embodiments of the present invention, this portion of the multilayer conductive stack and the top of the device are passivated with a passivation layer, such as an insulating layer to which a solder or eutectic die attach material will not wet. The passivation layer can be formed by conventional spin-on or deposition techniques such as Chemical Vapor Deposition (CVD) and/or reactive sputtering, and it can comprise an insulating oxide and/or nitride such as silicon dioxide and/or silicon nitride.

In some embodiments of the present invention, an opening in the passivation layer is then formed with lateral dimensions (i.e. surface area) that are smaller than the lateral dimensions of the barrier layer such that only a portion of the surface of the barrier layer is exposed. Such an opening can be produced using conventional photolithography and etching techniques. An optional adhesion layer that may comprise Ti, is formed in the opening and a thick bonding layer that may comprise Au, Sn and/or AuSn also is formed. In other embodiments, an optional solder wetting layer is provided between the adhesion layer and the bonding layer. The solder wetting layer can provide an enhanced mechanical connection between the solder and the LED, which can increase the shear strength of the connection.

In some embodiments of the present invention, the bonding layer can serve to protect the barrier layer if mechanical stress is to be applied to the multilayer conductive stack by a probe tip during electrical tests. Furthermore, in other embodiments of the present invention, the Au in the bonding layer can serve to protect the barrier layer from oxidation. In yet other embodiments of the present invention, AuSn may be employed in the bonding layer as a eutectic die attach material that may be used to bond an LED and a submount to one another via thermosonic or thermocompression bonding as an alternative to solder bonding.

Multilayer conductive stacks according to some embodiments of the present invention can be well suited for solid state devices in that some embodiments of the present invention can provide a stack that is considerably thinner than may be achieved if a solder barrier is formed using Ni or NiV. In some embodiments of the present invention, a barrier layer comprising W, TiW and/or TiNW and/or W and Ni layers can be less than half of the thickness that may be used if only Ni were used as the barrier layer. This may be advantageous when considering the generally small lateral dimensions of solid state devices and when considering the potential difficulty associated with the use of conventional fabrication techniques if large topographical dimensions are present. The barrier layer also can provide a desired vertical barrier against Sn and/or other undesired migration.

Passivation layers according to some embodiments of the invention can cover the entire epitaxial surface of the LED except for a reduced area opening that exposes the barrier layer, and can provide a dam to reduce or prevent Sn and/or other undesired migration into the reflective mirror layer or the ohmic contact, or down the edges of the metal stack. In the case of an LED having a conducting substrate, passivation layers according to some embodiments of the invention also can serve to keep the die attach material from contacting the substrate which could produce undesired effects such as formation of a parasitic Schottky diode.

Large area LEDs operating at high power levels may use packaging that has low thermal resistance to reduce or prevent degradation of the device performance. Epoxy based die attach materials may have high thermal resistance in comparison to metal die attach materials. In a flip-chip configuration, the p-n junction region of an LED is mounted extremely close to the heat sinking package, which can bypass the thermal resistance of the substrate. This may be used for large-area SiC-based LEDs in some embodiments of the present invention, despite the low thermal resistance of SiC. The metal—metal bond provided by some embodiments of the present invention also may be used in LEDs having sapphire substrates, due to the high thermal resistance of sapphire. Consequently, some embodiments of the present invention may be used for large area LEDs, which may benefit from employing a junction down (flip-chip) metal—metal die attach configuration. Other embodiments of the present invention may be used with small-area LEDs.

Some embodiments of the present invention also may increase the permissible temperature range that the device can withstand during subsequent packaging and assembly steps. Metal-metal bonds can be engineered for subsequent thermal cycles, for example, where the LED is mounted to a printed circuit board. If the LED die is attached to its submount with a AuSn thermosonic or thermocompression bond at 300° C. or by SnAg solder at 230° C., subsequent processing cycles using SnPb solder at 200° C. may not cause mechanical failure by reflowing the die attach bond. That is, subsequent processing at elevated temperatures may not cause the LED die to detach from the submount. In contrast, LEDs using epoxy based die attach methods may not withstand high thermal cycles. Moreover, clear epoxy can become discolored during thermal processing, resulting in unwanted light attenuation.

Some embodiments of the present invention may also increase the shear strength of resulting bonds between the LED and the submount. Inclusion of a solder barrier layer which reduces or prevents tin and/or other unwanted materials from reaching the epitaxial layers of the device can preserve the adhesive strength of the metal-semiconductor interface and can result in a more robust, mechanically stable device. In particular, it has been found that embodiments that include a nickel solder wetting layer beneath a gold bonding layer may exhibit superior shear strength.

In addition, some embodiments of the present invention may improve the thermal conductivity of the resulting device. This effect may be particularly apparent in so-called "power" or large area LEDs which may carry a substantially higher current than conventional LEDs. In such LEDs, some embodiments of the present invention can prevent or reduce "voiding" within the metallic layers. Voiding refers to the formation of physical voids or spaces within a metallic region. Some embodiments of the present invention may serve to maintain a tight grain structure within such metallic layers, thereby allowing the device to maintain a high thermal conductivity despite operation at high power levels with correspondingly high junction temperatures. Improved thermal conductivity also may help reduce degradation of encapsulant materials in which LEDs, and in particular power LEDs, are packaged. Such encapsulants are typically sensitive to heat and may yellow and become less transparent after expose to high temperatures for extended periods of time. By improving the thermal conductivity of the LED mount interface, less heat may be dissipated through the encapsulant, which can result in reduced degradation.

FIG. 1 illustrates an LED device precursor 10 according to some embodiments of the present invention, comprising a substrate 20 having first and second opposing faces 20a and 20b, respectively, and an epitaxial region 22 formed on the first face 20a of the substrate 20. Substrate 20 may comprise silicon carbide, sapphire, aluminum nitride, gallium nitride or any other suitable conductive or nonconductive substrate material. In some embodiments of the present invention, the substrate 20 comprises conductively doped SiC. In some embodiments of the present invention, the substrate 20 is transparent to optical radiation in a predetermined wavelength range. In some embodiments of the present invention, epitaxial region 22 comprises a conductive buffer layer and a plurality of Group III-nitride epitaxial layers, at least some of which provide a diode region. The dimensions of the substrate, epitaxial layers and metal layers shown in FIGS. 1–10 are not drawn to scale but are exaggerated for illustrative purposes. A thin $SiO_2$ and/or other layer (not shown) may optionally be formed, for example, by Plasma Enhanced Chemical Vapor Deposition (PECVD) on the surface of the epitaxial region 22 to protect it during subsequent processing and cleaning steps.

Figure 2:
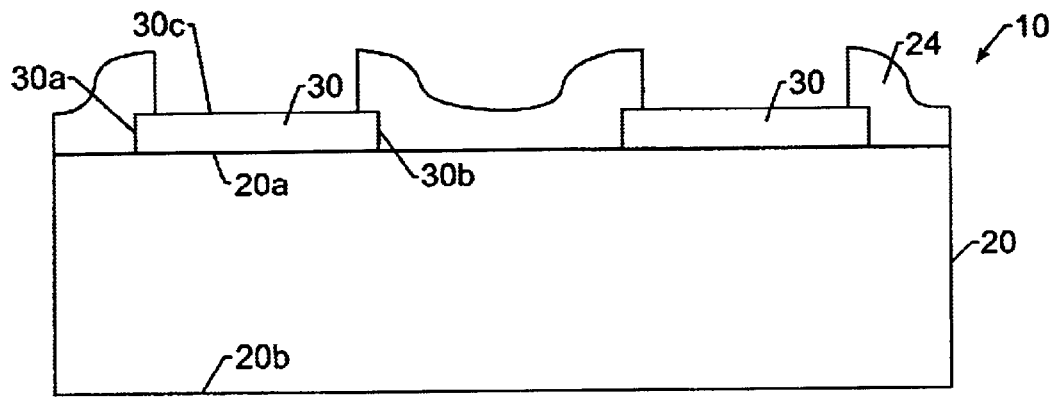

Subsequent to deposition of the epitaxial region 22, the epitaxial region 22 is patterned as shown in FIG. 2 to form a plurality of mesas 30 each having sidewalls 30a, 30b. Although not illustrated in FIG. 2, the mesas 30 may extend into the substrate 20. Moreover, in some embodiments of the present invention, the mesas 30 may be formed by selective epitaxial growth through openings in a mask, rather than blanket epitaxial growth and etching.

Still referring to FIG. 2, in some embodiments of the present invention, a layer of photoresist 24 and/or other material is formed on the surface of the precursor 10 and patterned to expose the surface of the mesas 30, thereby defining a first reduced area 30c on the surface of the mesas 30. If an optional $SiO_2$ layer is present, it may be etched through the openings in the photoresist 24 to expose the first reduced area 30c on the epitaxial surface layer of the epitaxial region 22 in the mesa 30.

Figure 3:
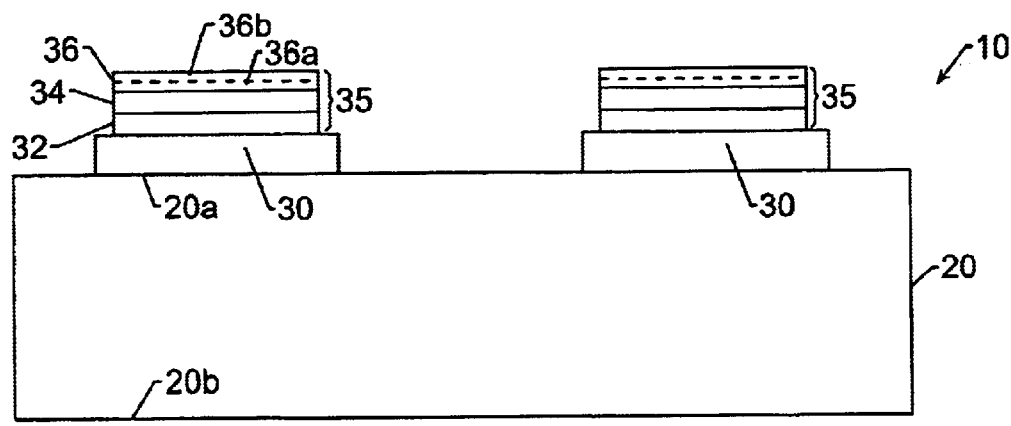

A multilayer conductive stack 35 is then formed on the first reduced areas 30c of the mesas 30 using, for example, conventional lift-off techniques. As shown in FIG. 3, the multilayer conductive stack 35 includes an ohmic layer 32, a reflector layer 34 and a barrier layer 36. In some embodiments of the present invention, the ohmic layer 32 comprises platinum, but in other embodiments it may comprise palladium, nickel/gold, nickel oxide/gold, nickel oxide/platinum, titanium and/or titanium/gold. Other embodiments of ohmic layers are described in the above-referenced application Ser. No. 10/057,821. If the ohmic layer 32 comprises Pt, it is about 25 Å thick in some embodiments of the present invention. The reflector layer 34 may comprise any suitable reflective metal, and may comprise Al or Ag. The reflector layer 34 is about 1000 Å thick in some embodiments of the present invention. Other embodiments of reflector layers are described in the above-referenced application Ser. No. 10/057,821.

In some embodiments of the present invention, the barrier layer 36 can be a solder barrier layer to prevent solder metals such as tin from reacting with the reflector layer 34 and/or ohmic layer 32. The barrier layer 36 comprises W, TiW and/or TiN/W and is between about 500 Å and about 50,000

Å thick in some embodiments of the present invention, and is about 5000 Å thick in other embodiments of the present invention. In other embodiments of the invention, the barrier layer 36 may comprise TiW having a composition of about 5% Ti and about 95% W.

Other embodiments of the barrier layer 36 that comprise tungsten or titanium/tungsten and that are between about 500 Å thick to about 3000 Å thick, may be used when a solder bonding operation (described below) is performed at a reflow temperature of less than about 210° C. For example, when eutectic gold/lead/tin solders are used at reflow temperatures of about 190° C. to about 210° C., a barrier layer comprising between about 500 Å and about 3000 Å of titanium/tungsten may be used, according to some embodiments of the present invention.

In other embodiments of the present invention, higher reflow temperatures may be used to accommodate other solders, such as solders comprising tin, silver and antimony, that have a reflow temperature of about 220° C. to about 260° C. One example of these solders is a Kester brand R276AC silver-tin solder paste that is about 96.5% tin and about 3.5% silver. Accordingly, in some embodiments of the present invention, the barrier layer 36 comprises a first layer of tungsten or titanium/tungsten 36a that is about 5000 Å thick, and a second layer 36b comprising nickel that is about 2000 Å thick, on the first layer, 36a. It has been found that some of these embodiments of the present invention can withstand temperatures of between about 325° and about 350° C., for about five minutes, without substantially increasing the forward voltage ($V_F$) or reduce the light output of the LED. Thus, in some embodiments of the present invention, a multilayer barrier layer 36 comprising a layer of tungsten or titanium/tungsten 36a and a layer of nickel 36b is used with solders that have a reflow temperature of more than about 200° C. In other embodiments of the present invention, these multilayer barrier layers may be used with solders that have a reflow temperature of more than about 250° C.

In some embodiments of the present invention, tungsten, silver and platinum are deposited, for example, using an e-beam technique. TiW may be deposited using an e-beam technique, but in other embodiments of the present invention, Ti and W are simultaneously sputter deposited. In addition, the TiW may be sputter deposited in the presence of nitrogen to form a TiN/TiW layer that also forms a barrier to Sn diffusion, in other embodiments of the present invention.

In yet other embodiments of the present invention, the barrier layer 36 may consist essentially of nickel or NiV. In other embodiments of the present invention, the barrier layer 36 may comprise a 2500 Å nickel solder barrier covered completely with a layer of gold between about 500 Å and 1,000 Å thick. The gold layer can prevent the nickel layer from oxidizing. However, the use of a nickel barrier layer may result in unacceptably high degradation of optical and electrical performance at elevated temperature and current levels due to tin migration. Moreover, thicker films of nickel may be difficult to use since the film stress may be high. This may create concern with respect to delamination of the nickel from the adjacent reflective and/or ohmic layers. Moreover, the presence of Au at the edges of the barrier layer may create a path for Sn to migrate down and around the edges of the barrier.

Figure 4:
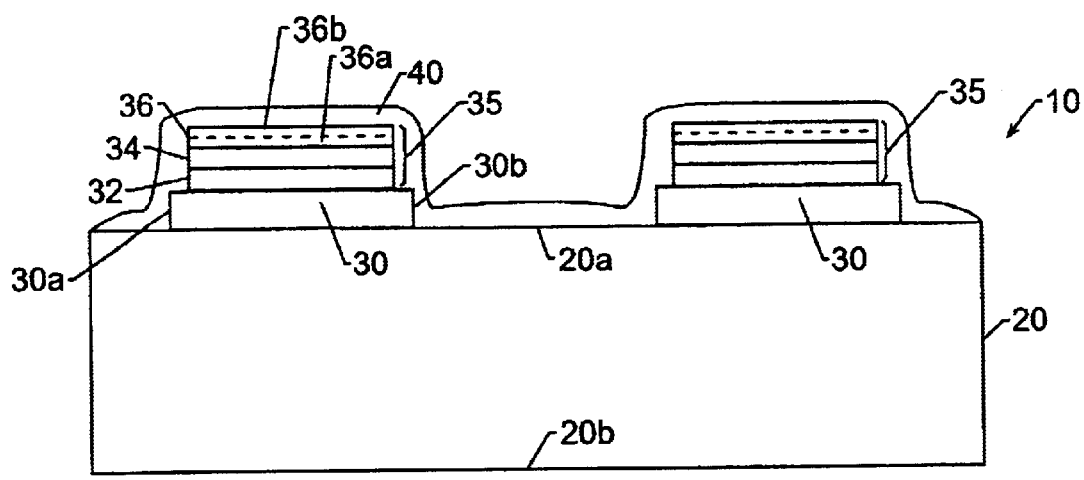

Referring now to FIG. 4, in some embodiments of the present invention, a passivation layer 40 is deposited or otherwise formed on the first (or epitaxial-side) surface 20a of device precursor 10. In some embodiments of the present invention, passivation layer 40 may comprise $SiO_2$ and/or SiN (which may be deposited in stoichiometric or non-stoichiometric amounts) and may be deposited by conventional techniques such as PECVD and/or reactive sputtering. The passivation layer 40 is about 1500 Å thick in some embodiments of the present invention. As also shown in FIG. 4, this blanket deposition also forms the passivation layer on the sidewalls of the mesas 30 and the multilayer conductive stack 35, and on the exposed surface of the barrier layer 36.

Figure 5:
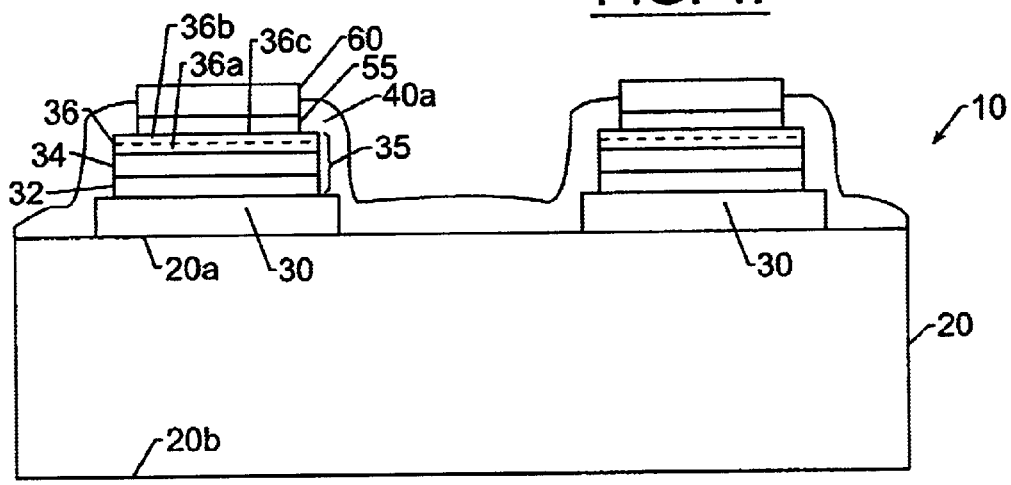

Referring now to FIG. 5, the passivation layer 40 is patterned with an etch mask (such as a photoresist) to provide a first patterned passivation layer 40a and to selectively reveal a second reduced area portion 36c of the surface of barrier layer 36. In other embodiments of the present invention, a lift off technique may be used to expose the second reduced area portion 36c of the surface of the barrier layer 36. In still other embodiments of the present invention, selective deposition of the passivation layer 40a may be used so that a separate patterning step need not be used.

Still referring to FIG. 5, an optional adhesion layer 55 comprising, for example, Ti is then deposited on the second reduced area 36c of the barrier layer 36 and a bonding layer 60 is deposited on the adhesion layer 55. These depositions may be performed using the patterned passivation layer 40a as a mask and/or using lift-off techniques. The adhesion layer 55 is about 1000 Å thick in some embodiments of the present invention. The bonding layer 60 may comprise Au, Sn and/or AuSn and is about 1000 Å thick in some embodiments. The bonding layer 60 may be up to about 1 μm thick (if Au) or about 1.7 μm thick (if AuSn) in some embodiments of the present invention. However, in some embodiments, use of a layer of Au that is thicker than about 1000 Å may lead to inconsistent solder reflow processing or Au embrittlement of the solder attachment, which may result in low shear strength. As shown, the patterned passivation layer 40a also is on the sidewalls of the adhesion layer 55 and the bonding layer, according to some embodiments of the present invention. In other embodiments, the patterned passivation layer 40a does not extend on the sidewalls of the adhesion layer 55 and the bonding layer 60. In these embodiments, the passivation layer may extend on the sidewalls of the conductive stack 35. According to other embodiments of the present invention, the bonding layer 60 extends away from the multilayer conductive stack 35, to beyond the patterned passivation layer 40a. In yet other embodiments, the bonding layer 60 does not extend to beyond the outer surface of the patterned passivation layer 40a.

For devices formed on conductive substrates, ohmic contacts and a wire bond pad (not shown) are formed on the second substrate face 20b opposite the epitaxial region to form a vertically-conductive device. Many such embodiments are described in application Ser. No. 10/057,821. For devices formed on non-conductive substrates, ohmic contacts and metal bonding layers (not shown) may be formed on an n-type epitaxial region of the device to form a horizontally-conductive device. Many such embodiments also are shown in application Ser. No. 10/057,821.

Figure 6:
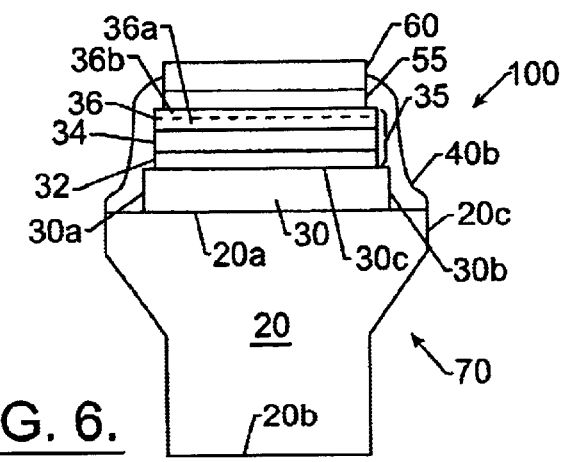

Referring now to FIG. 6, the precursor 10 is diced into individual light emitting diodes 100. FIG. 6 also shows that LEDs 100 may be sawed such that they have a beveled sidewall configuration 70 to increase light extraction. Many other embodiments of substrate shaping are described in application Ser. No. 10/057,821.

Accordingly, FIG. 6 illustrates light emitting diodes 100 according to some embodiments of the present invention that include a substrate 20, an epitaxial region (referred to previously as a mesa) 30 on the substrate 20 that includes therein a diode region, a multilayer conductive stack 35 on the epitaxial region 30 opposite the substrate 20, and a passivation layer 40b that extends at least partially on the multilayer conductive stack 35 opposite the epitaxial region 30, to define a reduced area bonding region 36c on the multilayer conductive stack 35 opposite the epitaxial region 30. In some embodiments, the passivation layer 40b also extends across the multilayer conductive stack 35, across the epitaxial region 30, and onto the first substrate face 20a. As also shown in FIG. 6, in some embodiments of the present invention, the multilayer conductive stack 35 and the epitaxial region 30 both include sidewalls, and the passivation layer 40b extends on the sidewalls of the multilayer conductive stack 35 and of the epitaxial region 30. As also shown in FIG. 6, a bonding layer 60 is provided on the bonding region 36c. The bonding layer 60 also includes a bonding layer sidewall, and the passivation layer 40b may or may not extend onto the bonding layer sidewall. Finally, an adhesion layer 55 may be provided between the multilayer conductive stack 35 and the bonding layer 60, and the passivation layer 40b also may or may not extend onto the sidewall of the adhesion layer 55 and/or the bonding layer 60.

Still referring to FIG. 6, in some embodiments of the present invention, the substrate 20 includes a first face 20a adjacent the epitaxial region 30 and a second face 20b opposite the epitaxial region. As illustrated in FIG. 6, the bonding layer 60 has smaller surface area than the multilayer conductive stack 35 and the multilayer conductive stack 35 has smaller surface area than the epitaxial region 30. The epitaxial region 30 has smaller surface area than the first face 20a. The second face 20b also has smaller surface area than the first face 20a.

FIG. 6 also illustrates light emitting diodes according to some embodiments of the invention that include a substrate 20 having first and second opposing faces 20a and 20b, respectively, the second face 20b having smaller surface area than the first face. An epitaxial region 30 is on the first face 20a, and includes therein a diode region. An ohmic layer 32 is on the epitaxial region 30 opposite the substrate 20. A reflector layer 34 is on the ohmic layer 32 opposite the epitaxial region 30. A barrier layer 36 is on the reflector layer 34 opposite the ohmic layer 32. An adhesion layer 55 is on the barrier layer 36 opposite the reflector layer 34. Finally, a bonding layer 60 is on the adhesion layer 55 opposite the barrier layer 36.

As also shown in FIG. 6, in some embodiments of the present invention, the barrier layer 36 comprises tungsten, titanium/tungsten and/or titanium nitride/tungsten. In other embodiments of the present invention, the tin barrier layer 36 comprises a first layer 36a comprising tungsten and a second layer 36b comprising nickel on the first layer 36a comprising tungsten.

As also shown in FIG. 6, in some embodiments of the present invention, the epitaxial region 30 has smaller surface area than the first face 20a. The barrier layer 36, the reflector layer 34 and the ohmic layer 32 have same surface area, that surface area being less than that of the epitaxial region 30. The adhesion layer 55 and the bonding layer 60 have same surface area, that surface area being smaller than that of the barrier layer 36, the reflector layer 34 and the ohmic layer 32.

Finally, as also shown in FIG. 6, in some embodiments of the invention, the epitaxial region 30, the ohmic layer 32, the reflector layer 34, the barrier layer 36, the adhesion layer 55 and the bonding layer 60 each include a sidewall and the light emitting diode 100 further includes a passivation layer 40b on the sidewalls of the epitaxial region 30, the ohmic layer 32, the reflector layer 34 and the barrier layer 36. The passivation layer also may or may not extend onto the sidewalls of the adhesion layer 55 and/or the bonding layer 60. The passivation layer 40b also may extend on the first face 20a of the substrate 20.

Figure 7:
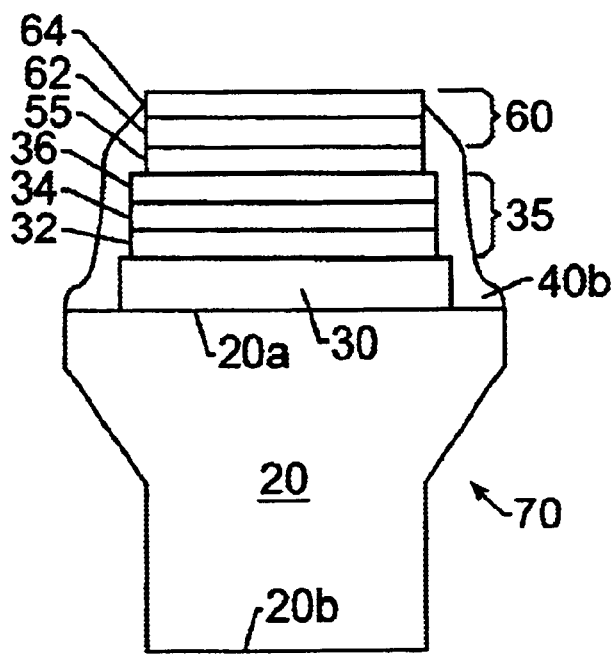

FIG. 7 illustrates other embodiments of the present invention in which the bonding layer 60 comprises a solder wetting layer 62 and a wetting passivation layer 64. In some embodiments, the solder wetting layer 62 comprises nickel and is about 2000 Å thick. In some embodiments, the wetting passivation layer 64 comprises Au and is about 500 Å thick. Use of the nickel solder wetting layer 62 can provide an enhanced mechanical bond to the solder, which can increase the shear strength of the connection and can reduce the possibility of mechanical failure, according to some embodiments of the invention.

Figure 8:
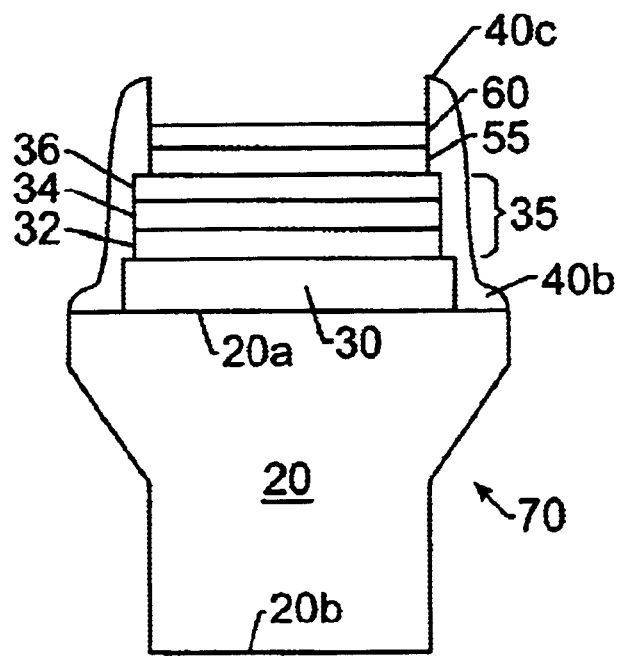

FIG. 8 illustrates other embodiments of the present invention in which the bonding layer 60 and optional adhesion layer 55 do not extend beyond the outer edge 40c of the passivation layer 40b. This configuration may be used when solder bonding is used to mount the LED to a lead frame, according to some embodiments of the invention.

FIGS. 1–8 also illustrate methods of fabricating a plurality of light emitting diodes according to some embodiments of the present invention. These methods comprise epitaxially forming a plurality of spaced apart mesa regions 30 on a substrate 20, the mesa regions including therein a diode region (FIG. 2). A first reduced area region 30c is defined on the mesa regions (FIG. 2). A multilayer conductive stack 35 that includes a barrier layer, is formed on the first reduced area regions 30c of the mesa regions 30 (FIG. 3). A passivation layer 40a is formed on the substrate 20 between the mesa regions 30, on exposed portions of the mesa regions and on exposed portions of the multilayer stack 35, the passivation layer 40a defining a second reduced area region 36c on the multilayer conductive stack 35 (FIGS. 4 and 5). A bonding layer 60 then is formed on the second reduced area regions 36c of the multilayer conductive stacks 35 (FIG. 5). The substrate 20 is diced between the mesas 30 to produce the plurality of light emitting diodes 100 (FIG. 6).

Figure 9:
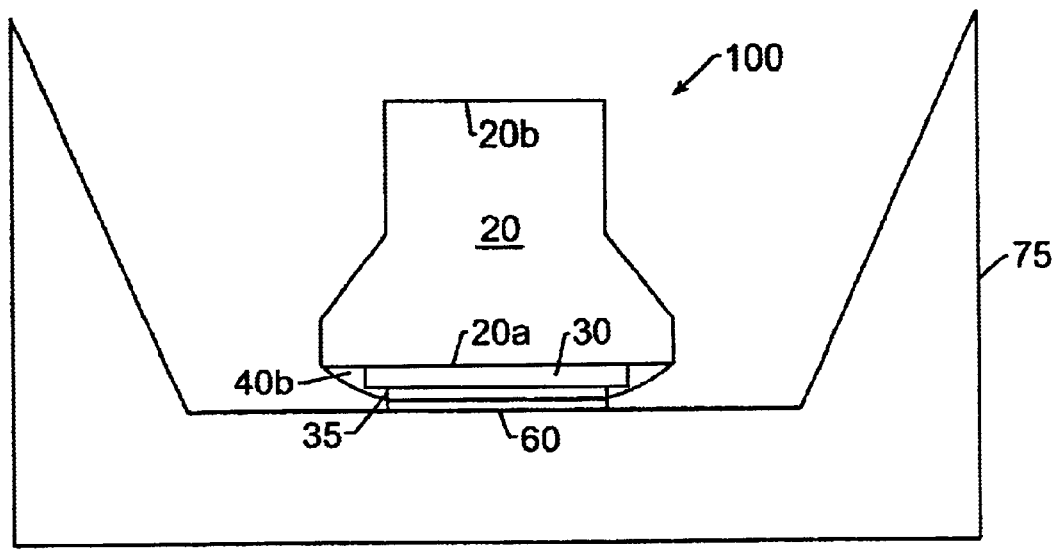
Figure 10:
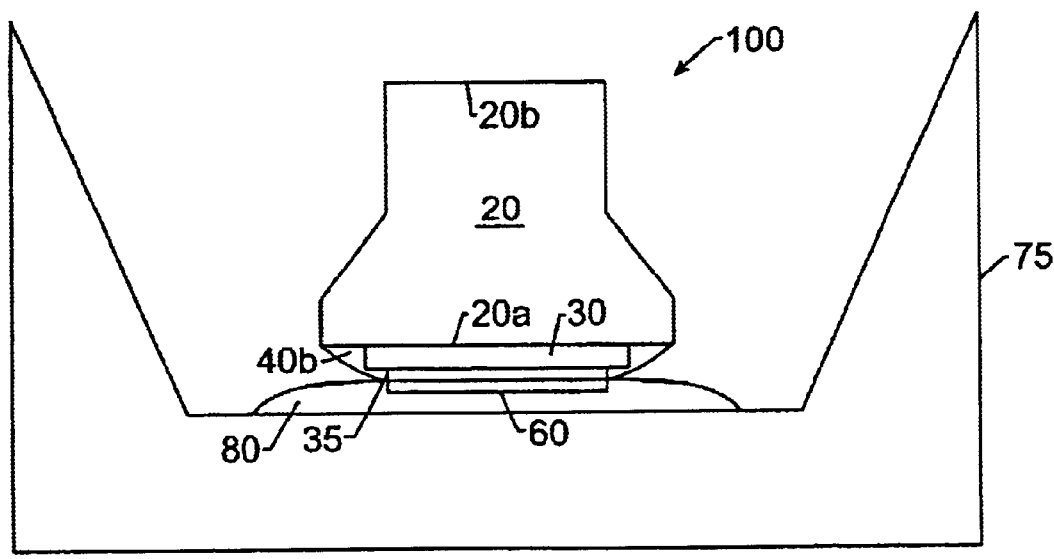

Referring now to FIGS. 9 and 10, once the LED 100 has been diced, the LED and a conductive submount 75 are attached to one another as illustrated in FIGS. 9 and 10. FIG. 9 illustrates embodiments of the present invention in which the LED 100 is mounted in a "flip-chip" configuration with the epitaxial side down, via thermosonic and/or thermocompression bonding. That is, instead of using an epoxy or a solder to form a mechanical connection or bond between the LED 100 and the submount 75, the bonding layer 60 of LED 100 is thermosonically or thermocompressively bonded directly to the submount 75 as described, for example, in U.S. Provisional Application Ser. No. 60/307,234.

In some embodiments of thermosonic or thermocompression bonding according to some embodiments of the present invention, the LED chip 100 is placed into mechanical contact with the submount and subjected to mechanical and/or sonic stimulation at a temperature greater than the eutectic temperature of the bonding metal. The bonding metal thus forms a bond with the metallic submount, which provides an electromechanical connection between the LED and the submount. In embodiments of the present invention in which the bonding layer 60 has an Au/Sn relative composition of about 80%/20%, the temperature used for thermosonic bonding may be approximately 300° C.

The presence of the barrier layer 36 and/or the passivation layer 40b can reduce or prevent unwanted interaction between metals in the bonding layer 60 with the reflective layer 34 and/or the ohmic layer 32. The barrier layer 36 and/or the passivation layer 40 may also serve to retard or inhibit unwanted migration of metal along the edge of the metal stack 35.

In other embodiments of the present invention, the LED 100 may be mounted on the submount 75 using a metal solder 80 such as SnAg, SnPb and/or other solders as illustrated in FIG. 10. The passivation layer 40b can reduce or prevent Sn from solder 80 from migrating to (and thereby potentially degrading) the reflective layer 34 and/or ohmic layer 32. The passivation layer 40b also can reduce or prevent conductive solder 80 from contacting the substrate 20 and mesa sidewalls, which may otherwise result in the formation of unwanted parasitic Schottky contacts to n-type regions of the device 100. Other bonding techniques that may be used, according to other embodiments of the present invention, are disclosed in the above-cited Provisional Application Ser. No. 60/307,311.

TEST RESULTS

The following test results are illustrative and shall not be construed as limiting the scope of the present invention. FIGS. 11A–11D graphically illustrate test results for a 2500 Å Ni solder barrier while FIGS. 12A–12D graphically illustrate results for a 5000 Å TiW barrier.

Figure 11A:
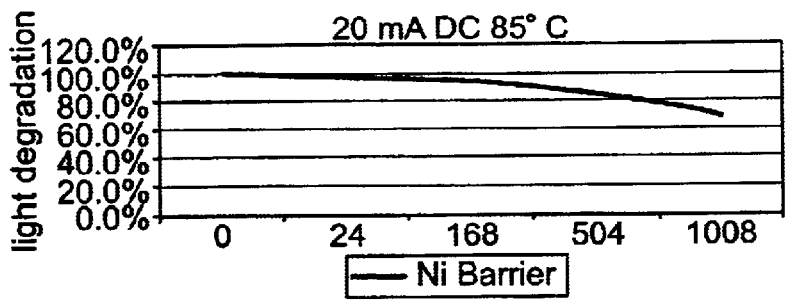
FIGS. 11A–12D graphically illustrate test results for light emitting diodes according to some embodiments of the present invention.
Figure 11B:
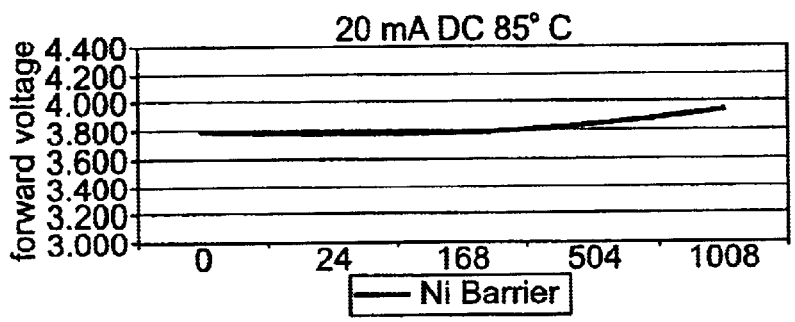
Figure 12A:
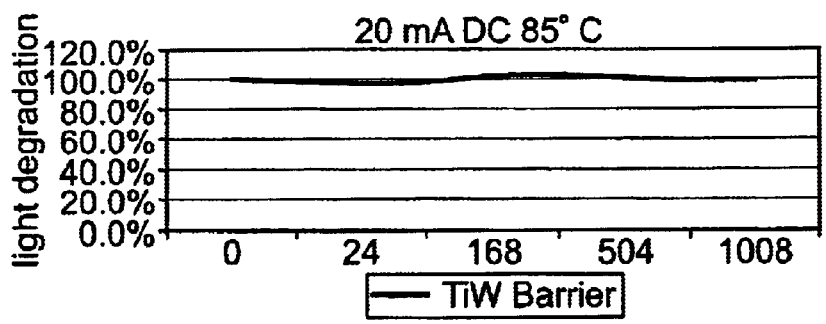
Figure 12B:
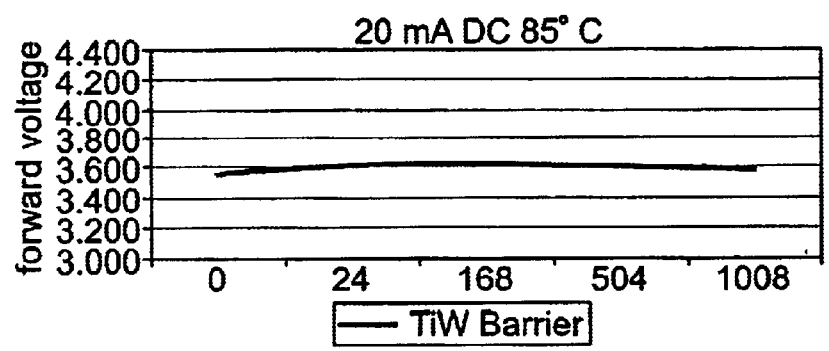

In a first test, the high temperature operating life (HTOL) of a number of LED samples was measured. In this test, twenty LEDs were fabricated with TiW solder barriers 36, SiN passivation layers 40b and gold bonding layers 60. Twenty LEDs also were fabricated with the same structure except that they used an Ni solder barrier. The devices were mounted on silver-plated 5 mm radial lead frames via solder bonding. The devices were then operated at a forward current of 20 mA while being maintained at a temperature of 85° C. Optical output power and $V_F$ were measured after 24, 168, 336, 504, 672, 864 and 1008 hours. As shown in FIGS. 11A and 12A, the devices with the Ni barrier exhibited larger degradation in light output, compared to the devices with the TiW barrier. Moreover, $V_F$ increased more in the Ni barrier devices (FIG. 1B) than in the TiW barrier devices (FIG. 12B).

Figure 11C:
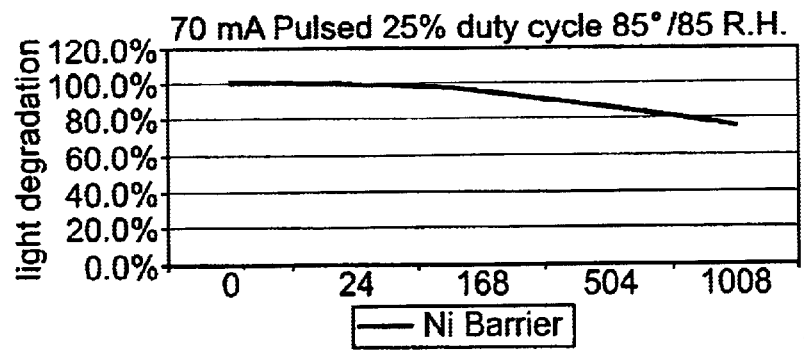
Figure 11D:
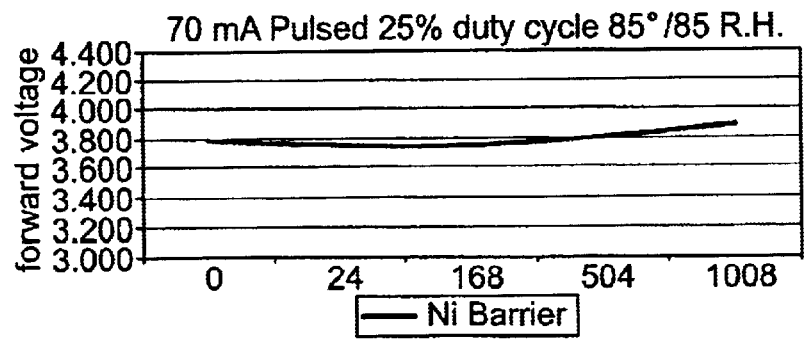
Figure 12C:
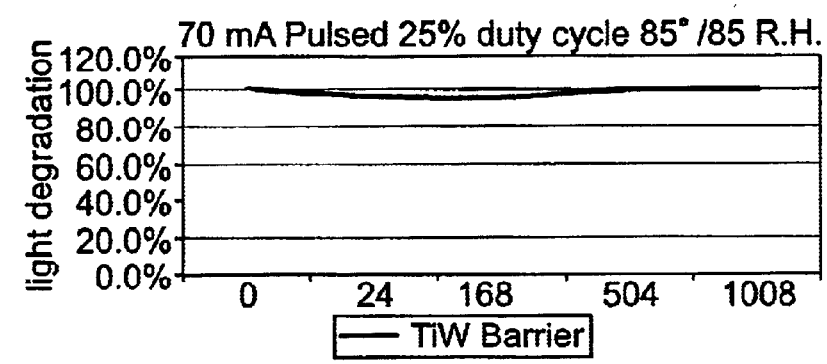
Figure 12D:
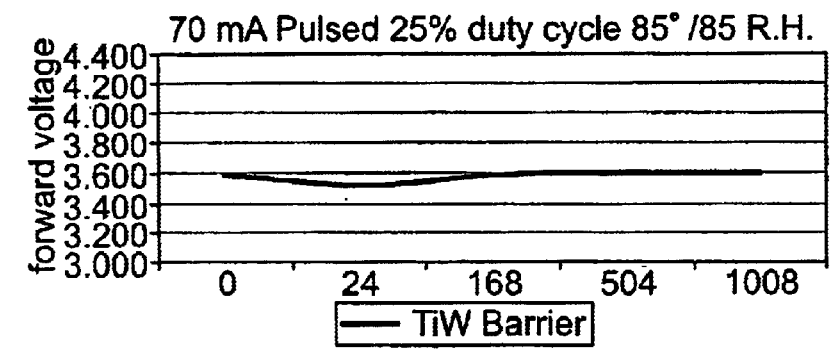

In a second test, twenty LEDs were fabricated with TiW solder barriers 36, SiN passivation layers 40b and gold bonding layers 60, and twenty LEDs were fabricated with the same structure except that they used the Ni barrier. The devices were mounted as described above in reference to the HTOL tests and operated at a pulsed forward current of 70 mA (25% duty cycle at 4 kHz) for a period of 504 hours while being maintained at a temperature of 85° C. and a relative humidity of 85%. Optical output power and $V_F$ were measured after 24, 168, 336, 504, 672, 864 and 1008 hours. As shown in FIGS. 11C and 12C, larger degradation in light output occurred with the Ni barrier and, as shown in FIGS. 11D and 12D, a larger increase in $V_F$ occurred with the Ni barrier.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A light emitting device comprising:
a substrate;
an epitaxial rotation having an epitaxial region thickness, on the substrate, and which includes therein a device region;
a multilayer conductive stack having a multilayer conductive stack thickness and including a barrier layer, on the epitaxial region; and
a passivation layer that extends at least partially on the multilayer conductive stack to define a bonding region on the multilayer conductive stack, the passivation layer also extending across the multilayer stack thickness across the epitaxial region thickness and onto the substrate:
wherein the passivation layer is non-wettable to a bonding material that is used to attach the bonding region to a submount.

2. A light emitting device according to claim 1 wherein the multilayer conductive stack includes a multilayer conductive stack sidewall, wherein the epitaxial region includes an epitaxial region sidewall and wherein the passivation layer extends on the multilayer conductive stack sidewall and on the epitaxial region sidewall.

3. A light emitting device according to claim 2 further comprising a bonding layer on the bonding region.

4. A light emitting device according to claim 1 further comprising an adhesion layer between the multilayer conductive stack and the bonding layer.

5. A light emitting device according to claim 4 wherein the adhesion layer includes an adhesion layer sidewall and wherein the passivation layer also extends on the adhesion layer sidewall.

6. A light emitting device according to claim 4 wherein the adhesion layer includes an adhesion layer sidewall and wherein the passivation layer does not extend on the adhesion layer sidewall.

7. A light emitting device according to claim 3 wherein the substrate includes a first face adjacent the epitaxial region and a second face opposite the epitaxial region, wherein the bonding layer has smaller surface area than the multilayer conductive stack, wherein the multilayer conductive stack has smaller surface area than the epitaxial region and wherein the epitaxial region has smaller surface area than the first face.

8. A light emitting device according to claim 7 wherein the second face has smaller surface area than the first face.

9. A light emitting device according to claim 3 wherein the bonding layer does not extend away from the multilayer conductive stack to beyond the passivation layer.

10. A light emitting device according to claim 1 wherein the bonding layer includes a bonding layer sidewall and wherein the passivation layer does not extend on the bonding layer sidewall.

11. A light emitting device according to claim 1 further comprising a submount and a bond between the bonding region and the submount.

12. A light emitting device according to claim 11 wherein the bond is a thermocompression bond.

13. A light emitting device according to claim 11 wherein the bond comprises solder.

14. A light emitting device according to claim 3 wherein the bonding layer extends away from the multilayer conductive stack to beyond the passivation layer.

15. A light emitting device according to claim 1 wherein the substrate comprises silicon carbide and wherein the epitaxial region comprises gallium nitride.

16. A light emitting device according to claim 1 wherein the multilayer conductive stack comprises an ohmic layer, a reflector layer and the barrier layer.

17. A light emitting device according to claim 16 wherein the ohmic layer comprises platinum, palladium, nickel/gold, nickel oxide/gold, nickel oxide/platinum, titanium and/or titanium/gold and wherein the reflector layer comprises aluminum and/or silver.

18. A light emitting device according to claim 16 wherein the barrier layer comprises tungsten, titanium/tungsten and/or titanium nitride/tungsten.

19. A light emitting device according to claim 18 further comprising a submount and a solder layer between the barrier layer and the submount.

20. A light emitting device according to claim 16 wherein the barrier layer comprises about 95% tungsten and about 5% titanium.

21. A light emitting device according to claim 1 wherein the barrier layer comprises tungsten, titanium/tungsten and/or titanium nitride/tungsten.

22. A light emitting device according to claim 21 further comprising a submount and a solder layer between the second layer comprising nickel and the submount.

23. A light emitting device according to claim 1 wherein the barrier layer comprises about 95% tungsten and about 5% titanium.

24. A light emitting device according to claim 1 wherein the barrier layer comprises means for reducing migration of contaminants into the multilayer conductive stack.

25. A light emitting device according to claim 24 wherein the means for reducing comprises a layer comprising tungsten.

26. A light emitting device comprising:
a substrate;
an epitaxial region having an epitaxial region thickness, on the substrate, and which includes therein a device region:
a multilayer conductive stack having a multilayer conductive stack thickness and including a barrier layer, on the epitaxial region; and
a passivation layer that extends at least partially on the multilayer conductive stack to define a bonding region on the multilayer conductive stack, the passivation layer also extending across the multilayerconductive stack thickness, across the epitaxial region thickness and onto the substrate;
wherein the bonding layer includes a bonding layer sidewall and wherein the passivation layer also extends on the bonding layer sidewall.

27. A light emitting device comprising:
a substrate;
an epitaxial region having an epitaxial region thickness, on the substrate, and which includes therein a device region; a multilayer conductive stack having a multilayer conductive stack thickness and including barrier layer on the epitaxial region;
a passivation layer that extends at least partially on the multilayer conductive stack to define a bonding region on the multilayer conductive stack, the passivation layer also extending across the multilayer conductive stack thickness, across the epitaxial region thickness and onto the substrate;
a bonding layer on the bonding region; and
a solder wetting layer between the multilayer conductive stack and the bonding layer.

28. A light emitting device according to claim 27 wherein the solder wetting layer comprises nickel.

29. A light emitting device comprising:
a substrate;
an epitaxial region having an epitaxial region thickness, on the substrate, and which includes therein a device region;
a multilayer conductive stack having a multilayer conductive stack thickness and including a barrier layer, on the epitaxial region; and
passivation layer that extends at least partially on the multilayer conductive stack to define a bonding region on the multilayer conductive stack, the passivation layer also extending across the multilayer conductive stack thickness, across the epitaxial region thickness and onto the substrate;
wherein the multilayer conductive stack comprises an ohmic layer, a reflector layer and the barrier layer; and
wherein the barrier layer comprises a first layer comprising tungsten and a second layer comprising nickel.

30. A light emitting device according to claim 29 wherein the first layer comprises titanium/tungsten.

31. A light emitting device according to claim 29 further comprising a submount and layer between the second layer comprising nickel and the submount.

32. A light emitting device comprising:
a substrate;
an epitaxial region having an epitaxial region thickness, on the substrate, and which includes therein a device region;
a multilayer conductive stack having a multilayer conductive stack thickness and including a barrier layer, on the epitaxial region; and
passivation layer that extends at least partially on the multilayer conductive stack to define a bonding region on the multilayer conductive stack, the passivation layer also extending across the multilayer conductive stack thickness, across the epitaxial region thickness and onto the substrate;
wherein the barrier layer comprises a first layer comprising tungsten and a second layer comprising nickel.

33. A light emitting device according to claim 32 wherein comprising a submount and a solder layer between the barrier layer and the submount.

34. A light emitting device according to claim 32 further comprising a submount and a solder layer between the second layer comprising nickel and the submount.

35. A light emitting device comprising:
a substrate;
an epitaxial region having an epitaxial region thickness, on the substrate, and which includes therein a device region;
a multilayer conductive stack having a multilayer conductive stack thickness and including a barrier layer, on the epitaxial region; and
passivation layer that extends at least partially on the multilayer conductive stack to define a bonding region on the multilayer conductive stack, the passivation layer also extending across the multilayer conductive stack thickness, across the epitaxial region thickness and onto the substrate;
a bonding layer on the bonding region; and
a shear strength enhancing layer between the multilayer conductive stack and the bonding layer.

36. A light emitting device according to claim 35 wherein the shear strength enhancing layer comprises nickel.

37. A light emitting device comprising:

a substrate;

an epitaxial region having an epitaxial region thickness, on the substrate, and which includes therein a device region;

a multilayer conductive stack having a multilayer conductive stack thickness and including a barrier layer, on the epitaxial region; and passivation layer that extends at least partially on the multilayer conductive stack to define a bonding region on the multilayer conductive stack, the passivation layer also extending across the multilayer conductive stack thickness, across the epitaxial region thickness and onto the substrate;

wherein the multilayer conductive stack comprises:

an ohmic layer on the epitaxial region opposite the substrate;

a reflector layer on the ohmic layer opposite the epitaxial region;

the barrier layer on the reflector layer opposite the ohmic layer;

an adhesion layer on the barrier layer opposite the reflector layer; and a bonding layer on the adhesion layer opposite the barrier layer.

38. A light emitting device according to claim 37 further comprising a submount and a bond between the bonding layer and the submount.

39. A light emitting device according to claim 38 wherein the bond is a thermacompression bond.

40. A light omitting device according to claim 38 wherein the bond comprises solder.

41. A light emitting device according to claim 40 wherein the solder comprises tin and/or gold.

42. A light emitting device according to claim 40 wherein the solder has a reflow temperature of less than about 210° C. and wherein the barrier layer comprises a layer of titanium/tungsten that is between about 500 Å thick and about 50,000 Å thick.

43. A light emitting device according to claim 40 wherein the solder has a reflow temperature of more than about 210° C. and wherein the barrier layer comprises a first layer of titanium/tungsten that is about 5000 Å thick and a second layer comprising nickel that is about 2000 Å thick, on the first layer.

44. A light emitting device according to claim 40 wherein the solder has a reflow temperature of more than about 250° C. and wherein the barrier layer comprises a first layer of titanium/tungsten that is about 5000 Å thick and a second layer comprising nickel that is about 2000 Å thick, on the first layer.

45. A light emitting device according to claim 37 wherein the substrate comprises silicon carbide and wherein the epitaxial region comprises gallium nitride.

46. A light emitting device according to claim 37 wherein the ohmic layer comprises platinum, palladium, nickel/gold, nickel oxide/gold, nickel oxide/platinum, titanium and/or titanium/gold and wherein the reflector layer comprises aluminum and/or silver.

47. A light emitting device according to claim 37 wherein the barrier layer comprises titanium, titanium/tungsten and/or titanium nitride/tungsten.

48. A light emitting device according to claim 37 wherein the barrier layer comprises about 95% tungsten and about 5% titanium.

49. A light emitting device according to claim 37 wherein the barrier layer comprises a first layer comprising tungsten and a second layer comprising nickel.

50. A light emitting device according to claim 49 wherein the first layer comprises titanium/tungsten.

51. A light emitting device according to claim 37 wherein the epitaxial region has smaller surface area than the first face, wherein the barrier layer, the reflector layer and the ohmic layer have same surface area that is less than that of the epitaxial region and wherein the adhesion layer and the bonding layer have same surface area that is less than that of the barrier layer, the reflector layer and the ohmic layer.

52. A light emitting device according to claim 51 wherein the epitaxial region, the ohmic layer, the reflector layer, the barrier layer, the adhesion layer and the bonding layer each include a sidewall, the light emitting device further comprising a passivation layer on the sidewall of the epitaxial region, the ohmic layer, the reflector layer, the barrier layer, the adhesion layer and the bonding layer.

53. A light emitting device according to claim 52 wherein the passivation layer also is on the first face of the substrate.

54. A light emitting device according to claim 52 further comprising a submount and a solder layer between the bonding layer and the submount, wherein the passivation layer is non-wettable to the solder layer.

55. A light emitting device according to claim 37 wherein the epitaxial region, the ohmic layer, the reflector layer, the barrier layer, the adhesion layer and the bonding layer each include a sidewall, the light emitting device further comprising a pessivation layer on the sidewalls of the epitaxial region, the ohmic layer, the reflector layer, the barrier layer, the adhesion layer and the bonding layer.

56. A light emitting device according to claim 37 further comprising a solder wetting layer between the adhesion layer and the bonding layer.

57. A light emitting device according to claim 37 further comprising a shear strength enhancing layer between the adhesion layer and the bonding layer.

* * * * *

UNITED STATES PATENT AND TRADEMARK OFFICE
CERTIFICATE OF CORRECTION

PATENT NO. : 6,740,906 B2
DATED : May 25, 2004
INVENTOR(S) : Slater, Jr. et al.

It is certified that error appears in the above-identified patent and that said Letters Patent is hereby corrected as shown below:

<u>Title page,</u>
Item [56], References Cited, FOREIGN PATENT DOCUMENTS, should include:

-- JP     06-232510     08/1994
   JP     1-225377      09/1999
   JP     56-131977     10/1981 --

<u>Column 14,</u>
Line 4, should read -- an epitaxial region having an epitaxial region thickness. --
Line 13, should read -- layer also extending across the multilayer conductive stack thick- --
Line 25, should read -- 3. A light emitting device according to claim 1 further --
Line 27, should read -- 4. A light emitting device according to claim 3 further --

<u>Column 15,</u>
Lines 21-23, should read -- 22. A light emitting device according to claim 21 wherein the first layer comprises titanium/tungsten. --
Line 44, should read -- layer also extending across the multilayer conductive --
Line 56, should read -- layer conductive stack thickness and including a barrier --

<u>Column 16,</u>
Lines 25-26, should read -- comprising a submount and a solder layer between the barrier layer and the submount. --
Lines 44-46, should read -- 33. A light emitting device according to claim 32 further comprising a submount and a solder layer between the second layer comprising nickel and the submount. --

UNITED STATES PATENT AND TRADEMARK OFFICE
CERTIFICATE OF CORRECTION

PATENT NO. : 6,740,906 B2
DATED : May 25, 2004
INVENTOR(S) : Slater, Jr. et al.

It is certified that error appears in the above-identified patent and that said Letters Patent is hereby corrected as shown below:

Column 17,
Line 34, should read -- 40. A light emitting device according to claim 38 wherein --

Signed and Sealed this

Fourteenth Day of December, 2004

JON W. DUDAS
*Director of the United States Patent and Trademark Office*